United States Patent [19]

Ohno et al.

[11] Patent Number: 5,255,226
[45] Date of Patent: Oct. 19, 1993

[54] SEMICONDUCTOR MEMORY DEVICE WITH A REDUNDANCY CIRCUIT BYPASSING FAILED MEMORY CELLS

[75] Inventors: Kazuki Ohno; Tasuharu Hoshino, both of Tokyo, Japan

[73] Assignee: NEC Corporation, Tokyo, Japan

[21] Appl. No.: 709,565

[22] Filed: Jun. 3, 1991

[30] Foreign Application Priority Data

Jun. 1, 1990 [JP] Japan ................... 2-143439

[51] Int. Cl.$^5$ ............................... G11C 7/00
[52] U.S. Cl. ................. 365/189.12; 365/210; 365/225.7
[58] Field of Search ............. 365/189.12, 225.7, 210, 365/220; 371/10.2, 10.3

[56] References Cited

U.S. PATENT DOCUMENTS 4,719,601  1/1988  Gray et al. .............. 365/189.12

Primary Examiner—Steven Mottola
Attorney, Agent, or Firm—Sughrue, Mino, Zinn, Macpeak & Seas

[57] ABSTRACT

In a redundancy circuit, there is provided a data-transfer path switching circuit for switching on path-switching signals paths on which data is transferred from the data-storage places of the write shift register through the memory cell array to the data-storage place. Path switching signals are generated by blowing the fuse link corresponding to the number of data pieces input into the write shift register. The construction that the data to be read out first is transferred to the last data-storage place of the output circuit increases the speed of read-out without shifting previously to readout when a shift register is used as output circuit. With a data register as output circuit, the output control circuit is fixed, thereby eliminating the need for trouble-some decoder switching.

14 Claims, 8 Drawing Sheets

SEMICONDUCTOR MEMORY DEVICE WITH A REDUNDANCY CIRCUIT BYPASSING FAILED MEMORY CELLS

BACKGROUND OF THE INVENTION

This invention relates to a semiconductor memory device and, more particularly, to a redundancy circuit provided in a semiconductor memory device used especially for an image or video data processing operation to temporarily store data supplied in a bit-serial manner and then read out the stored data in a bit-serial manner.

DESCRIPTION OF THE PRIOR ART

In a video data processing operation, video data to be processed are most often stored temporarily in a semiconductor memory device such as DRAM and thereafter read out therefrom at a predetermined timing. The video data for one line of a raster scan type display screen are dealt with as one unit and are stored in a bit-serial manner. Accordingly, the semiconductor memory includes an input circuit provided with a shift register having a plurality of data storage and shift stages necessary to hold the video data for one line. Since the video data for one line are read out in a bit-serial manner, the semiconductor memory device also includes an output circuit provided with a data register or a shift register having a plurality of storage stages necessary to hold those data.

There is further provided a memory cell array comprising groups of memory cells corresponding to a plurality of lines, each memory cell group storing one-line data being taken as a unit, between the shift register in the input circuit (referred to as "write shift register" hereinafter) and the data register or shift register in the data output circuit (referred to as "read data register" or "read shift register" hereinafter). Any memory cell group is selected by a word line.

The operation of this semiconductor memory device, assuming that the output circuit is constructed of a data register, will be described below.

Data to be processed are inputted in bit-serial way into the write shift register. Once one-line data are each held in one place of this register, respectively, these data are transferred in parallel to the memory cell array, and stored in the memory cell group selected by the word line.

The one-line data stored in the memory cell array are selected by the word line and transferred in parallel under a specified timing to the read data register and each one line data held in one place of the read data register respectively. These data held in the places of the read data register are, under the control of a control signal from the output control circuit, transferred in the bit-serial manner to the output bus and outputted from the output terminal.

Assuming that the output circuit is constructed of a shift register, one-line data from the memory cell array are transferred to and held in the read shift register and then outputted in the bit-serial manner from the last stage of the shift register to the output bus.

In such a semiconductor memory device, there is usually provided a redundancy circuit for replacing defective memory cell(s) in the memory cell array with normal memory cell(s) to thereby prevent the memory chip from being rejected.

This redundancy circuit configuration is similar to above-stated configuration except the number of stages in each circuit, and comprises a redundancy write shift register, a redundancy memory cell array, and either a redundancy read data register with the associated output circuit or a redundancy read shift register, which correspond to the above-described regular shift register, regular memory cell array, and either regular read data register with the associated output control circuit or regular read shift register, respectively.

The number of the stages or columns in each redundancy circuit is determined by taking into consideration a predicted number of memory cells in the regular memory cell array which may have failed, the size of the memory chip, economical respect, and etc.

The operation of this redundancy circuit, particularly with an output circuit consisting of a data register, will be described below.

In write mode, data to be processed is inputted in the bit-serial manner into the regular write shift register and sequentially held in each stage thereof. In this process, the data written in a failed memory cell, when found, in the regular memory cell array is inputted and held in the redundancy write register as well. In the redundancy write shift register, when a plurality of failed memory cells are found in one line, the following data inputted thereinto is held in the first place, and the data of each place, if already held, is shifted to the next place.

When all the one-line data are held in the regular write shift register, they are transferred to and then stored into the regular memory cell array. In synchronism with this, the data of the redundancy write shift register are transferred to and stored into the redundancy memory cell array.

In a read mode, from the regular memory cell array and the redundancy memory cell array, respective one-line data are synchronously transferred to, and held in, the regular read data register and the redundancy read data register, respectively. The data held in the stages of the regular read-data register are in sequence transferred to the output bus under the control of output control signals from the regular output control circuit.

This transfer is carried out in the order from the first place to the last. When the data transfer from regular read data register to the output bus moves to the stage corresponding to a defective memory cell, the data transfer from the regular read data register is interrupted, and instead the data transfer from the redundancy read data register to the output bus is carried out. This transfer of data from the redundancy read data register is performed in the same order as in the input of them under the control of output control signals from the redundancy output control circuit.

In this way, even if one or more memory cells in the regular memory cell array are faulty, all the input data can be outputted through normal process of write, storage, and readout.

The data corresponding to failed memory cells are held in sequence in the first places of the redundancy write shift register, and in turn transferred to and stored in, the redundancy memory cell array, and read out, and held similarly in the first places of the redundancy read data register.

The number of failed or faulty memory cells varies among semiconductor chips, and it is rare that all the places or columns in the redundancy circuit are loaded. Therefore in read mode, at what place in the redundancy read data register, the readout of data begins, varies among memory chip. What place(s) in the redundancy read data register data is (are) read from depends on the contents of the decoders in the redundancy output circuit corresponding to the places of the redundancy read data register. It is therefore needed to alter the contents of the decoders in the redundancy control circuit among memory chips. This work is complicated and liable to result in incorrectly altering the contents of these decoders.

On the other hand, in the case where the output circuit consists of a shift register, data from the redundancy memory cell array are held in sequence in the redundancy read shift register from the first place to the last, and are outputted from the last place, as described above. When the position of the regular read shift register at which the data is to be read out shifts to the position corresponding to the defective memory cell, the redundancy read shift register is required to be subjected to the data read operation. Therefore, the data must have been shifted to the last place of the redundancy read shift register. However, since it is unable to locate failed memory cell(s) in one line, this shift operation must be completed prior to starting the output of data.

In this case, while troublesome work of altering the contents of the decoders is omitted, the reading out of data slows down owing to inevitable insertion of shift operation prior to the data output.

The above description can be applied in the case where one or more failed memory cells are found in one line only or the same number of failed memory cells are found in each of a plurality of lines.

In the case where the number of failed memory cells varies among a plurality of lines, when the output circuit consists of a data register, the number of decoders of the output control circuit increases. Additionally it is necessary to alter the contents thereof, resulting in an increase in mistakes. When a shift register is used in the output circuit, as in the well as slow-down of readout operation mentioned above, it is necessary to alter the number of places to be shifted previously to starting the output of data for every line, this reflecting a complicated circuit for generating shift signals.

SUMMARY OF THE INVENTION

It is, therefore, an object of the present invention to provide a semiconductor memory device with a redundancy circuit capable of functioning in a simplified way to bypass failed memory cell(s).

Another object of the present invention is to provide a semiconductor memory device with a redundancy circuit for enhancing a data read-out operation speed.

Still another object of the present invention is to provide a semiconductor memory with a redundancy circuit capable of functioning in easy manner to bypass failed memory cell(s) even when the defective memory cell exists in a plurality of rows of the regular memory cell array with the different number among rows.

A semiconductor memory device according to the present invention comprises a redundancy memory cell array including a plurality of memory cells arranged in rows and columns, a redundancy write shift register having a plurality of shift stages of the same number as the number of the columns of the redundancy memory cell array and capturing and shifting data in sequence, a write data transfer circuit for transferring data from the each stage of this redundancy write shift register to the corresponding column of the redundancy memory cell array, a redundancy data output circuit for capturing in parallel data supplied thereto and outputting the captured data in a bit-serial manner, a read data transfer circuit for transferring data from the redundancy memory array to the redundancy data output circuit, data transfer path controlling means provided between the redundancy write shift register and the redundancy memory cell array or between the redundancy memory cell array and the redundancy data output circuit for controlling data transfer paths such that respective data from the shift stages of the redundancy write shift register are transferred to the corresponding stages or different stages of the redundancy data output circuit in response to path switching signal, and a signal generator for generating the path switching signal.

Preferably, the redundancy data output circuit includes a redundancy read shift register for capturing respective data from the columns of the redundancy memory cell array in parallel and shifting and outputting the data in a bit-serial manner.

Preferably, the redundancy data output circuit is composed of a read data register for capturing and holding respective data from the outputs of said read data transfer circuit in corresponding places thereof, an output bus, an output transfer circuit for transferring, under control of output control signals, respective data held in the stages of the read data register to the output bus, in sequence, and an output-control signal generating circuit for generating output control signals.

Preferably, the data transfer switching means includes a plurality of switch elements, each being provided between the jth input and the [j+(N-k)]th output and, when the kth path switching signal is at active level, turned on, wherein j is any integer from 1 ascending to N allocated to the inputs and outputs, respectively, of the data transfer path switching means, in sequence from respective one end, and k is any integer from 1 to N and k≧j; and the path-switching signal generating circuit is a circuit for causing the kth one of the path switching signals to go to active level when the number of data pieces input into the redundancy write shift register is k.

Preferably path-switching signal generating circuit is a circuit, containing the fuse links corresponding respectively to the path-switching signals, for causing an appropriate path switching signal to go to active level by the blowing of a corresponding one from the fuse links.

Preferably the first input and the first output of the data-transfer path switching means are connected through a conductor.

Preferably there is provided only a data-transfer switching means either between the redundancy write shift register and the redundancy memory cell array or between the redundancy memory cell array and the redundancy data output circuit, and the path-switching signal generating circuit is a circuit for generating a path switching signal which is at active level only when either write data-transfer signal or read-data transfer signal is at alive level.

Preferably there is provided between said data-transfer path switching means and said path-switching signal generating circuit a path-switching signal selecting circuit for selecting one from a plurality of path switching signals output from said path-switching signal generating circuit by the word line selecting the memory cells of the redundancy memory cell array, and supplying the selected path switching signal to said data-transfer path switching means.

There may be provided data-transfer switching circuit means between the output-control signal generating circuit and the output data-transfer circuit in the redundancy data-output circuit, for the purpose of switching output control signal supplied to the output data transfer circuit by a switching signal.

The constructions described above bring the switching work setting to the number of input data pieces with only a very simple procedure of blowing the corresponding fuse link to that number, with the effect that when the redundancy data output circuit is constructed of a data register, the risk of mistake involving the switching work is minimized. On the other hand, when constructed of a shift register, the data to be read out is held in the last place of the register, inevitably making the data shift operation previous to readout unnecessary, and in turn, readout speeds up.

Besides, when there are failed memory cells different in number in a plurality of lines, nothing is needed except adding one circuit for selecting one from a plurality of path-switching signals or switching signals by word lines on which failed memory cells are found, and an effect of simplifying the switching circuit is obtained.

BRIEF DESCRIPTION OF THE DRAWINGS

The above and other objects, features and advantages of this invention will become more apparent with reference to the following detailed description of the invention taken in conjunction with the accompanying drawings, wherein.

DETAILED DESCRIPTION OF THE INVENTION

Figure 1:
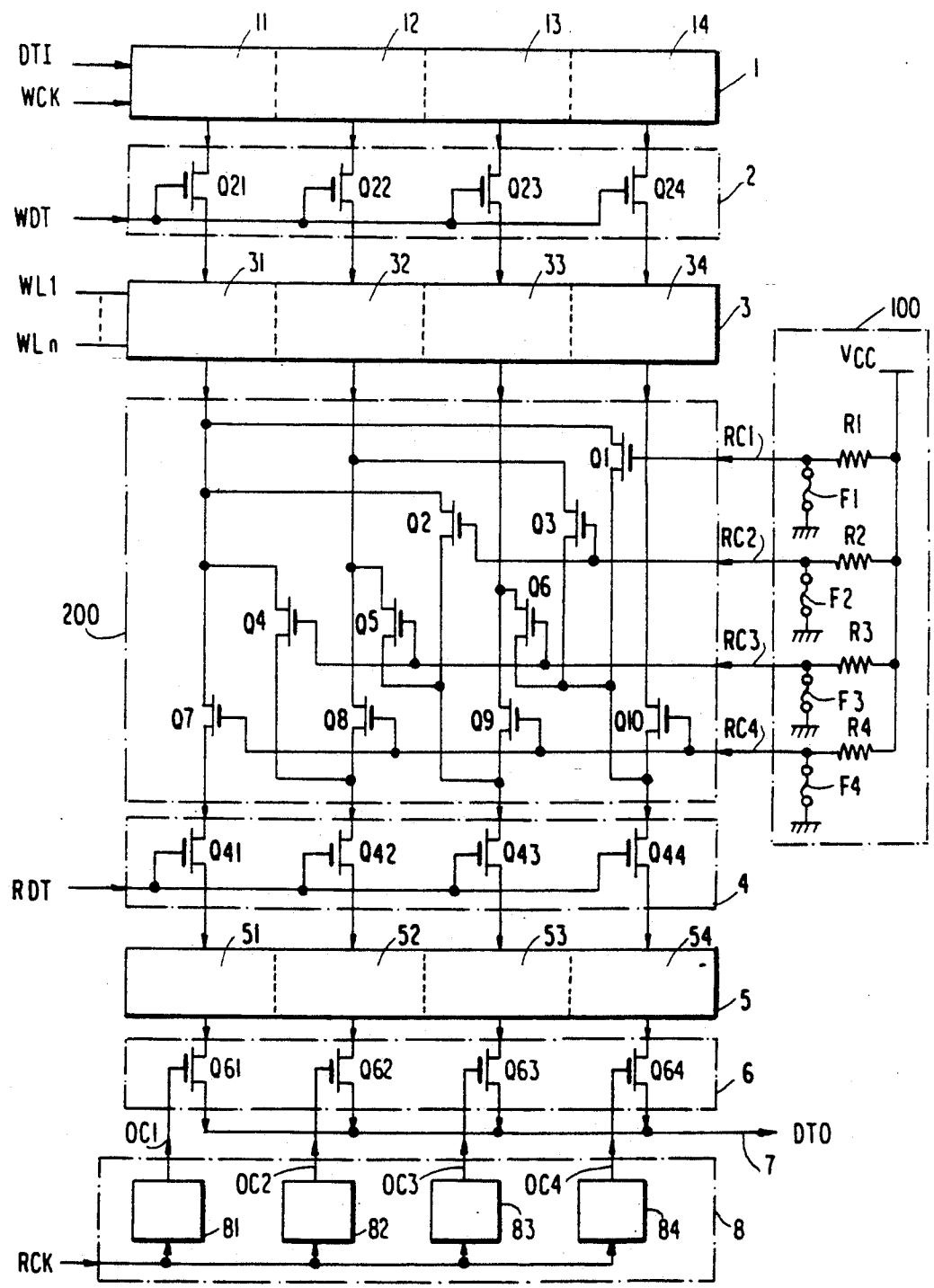
FIG. 1 is a circuit diagram of a first embodiment of the present invention involving a redundancy circuit in a semiconductor memory device.

Referring first to FIG. 1, the first embodiment of the present invention involving a redundancy circuit for a semiconductor memory device will be described hereinafter.

Redundancy write shift register 1 has four stages 11 to 14 for storing data. At the time when data is inputted into the stage of a regular write data register (not shown) corresponding to a failed memory cell, data DTI is applied to an input terminal of the register 1. In synchronism with a clock signal WCK, the data DTI is captured and stored in the first place 11. At this time, the register 1 has already has another data, and this data is shifted to the next stage. Respective data stored in the stages 11 to 14 are outputted from the respective output nodes thereof.

A write data transfer circuit 2 includes transistors Q21 to Q24 which are turned on by the active level of a write-data transfer signal WDT. The respective data from the stages 11 to 14 of the redundancy write shift register 1 are at the same time (in parallel) transferred to the corresponding memory cell columns 31 to 34 of a redundancy memory cell array 3. This redundancy memory cell array 3 is organized as an n rows × 4 columns arrangement (or matrix) of memory cells. Each memory cell columns 31 to 34 contains n memory cells in total. "n" rows are selected by respective word lines WL1 to WLn common to redundancy memory cell array 3 and the regular memory cell array (not shown). Each column 31 to 34 of redundancy memory cell array 3 includes totally "n" memory cells per row. The respective memory cells selected from memory cell columns 31 to 34 by one of word lines WL1 to WLn are written and stored with the data from the corresponding outputs of redundancy write shift register 1. In a read mode, respective data (up to 4 bits in total) stored in the memory cells of memory cell columns 31 to 34 selected by one of word lines WL1 to WLn are read out. These read data are inputted into a data-transfer path switching circuit 200 which is provided in accordance with the present invention and described in detail later.

4-bit data outputted from the data-transfer path switching circuit 200 are inputted into a read data transfer circuit 4. In this circuit 4, when read-data transfer signal RDT goes active, transistor Q41 to Q44 are turned on to transfer the inputted data to the corresponding stages of a read-data resistor 5 of a redundancy data output circuit. The redundancy data output circuit is composed of the read data register 5, an output-data transfer circuit 6, an output bus 7, and an output-control signal generating circuit 8. The read data register 5 has four stages 51 to 54. Respective data from transistor Q41 to Q44 of the read data transfer circuit 4 are captured and held in the corresponding stages 51 to 54 of the read data register 5. Output-data transfer circuit 6 comprises transistors Q61 to Q64, each being turned on when the corresponding one of output control signals OC1 to OC4 goes active. The respective data held in the stages of the read data register 5 are thereby transferred in sequence to the output bus 7 under the control of output control signals OC1 to OC4, and derived as output data DTO. Output-control signal generating circuit 8 is composed of decoders 81 to 84, and outputs the control signals OC1 to OC4 which go active in sequence under the timing of read clock signals RCK occuring in synchronism with each data read-out timing from failed memory cells in a normal memory cell array (not shown).

In this embodiment, there is provided between the redundancy memory cell array 3 and the read data transfer circuit 4 a data-transfer path switching circuit 200 which responds to switching control signals RC1 to RC4 and connects appropriate one of the data-transfer paths from the memory cell columns 31 to 34 of redundancy memory cell array 3 to the corresponding transistor Q41 to Q44 of read data transfer circuit 4. A path-switching-signal generating circuit 100 generates the switching signals RC1 to RC4. The circuit 200 includes switching transistors Q1 to Q10 connected as shown. Now it is assumed that j is any integer from 1 ascending to N allocated to the inputs and outputs, respectively, of the data-transfer path switching circuit 200 in sequence from respective one ends (corresponding to memory cell columns 31 to 34 of redundancy memory cell array 3 and to transistor Q41 of data transfer circuit 4), and k is any integer from 1 to N and k≧j allocated to path switching signals, hence designated with RCk. Then those transistors Q1 to Q10, which are termed switch elements, are connected between the jth (j=1, 2, 3, and 4) input and the [j+(4−k)]th (k=1, 2, 3, and 4), and turned on when path switching signal k is at active level. Individually, transistor Q7 turned on or off by path switching signal RC4 (k=4) is connected between input J(=1) and output j(=1), transistor Q4 turned on or off by path switching signal RC3 (k=3) between input J(=1) and output j(=2), transistor Q2 turned on or off by path switching signal RC2 (k=2) between input J(=1) and output j(=3), and transistor Q1 turned on or off by path switching signal RC1 (k=1) between input J(=1) and output j(=4), respectively. Besides transistor Q8 turned on or off by path switching signal RC4 (K=4) is connected between input J(=2) and output j(=2), transistor Q5 turned on or off by path switching signal RC3 (K=3) between input J(=2) and output j(=3), transistor Q3 turned on or off by path switching signal RC2 (k=2) between input J(=2) and output j(=4), transistor Q9 turned on or off by path switching signal RC4 (k=4) between input J(=3) and output j(=3), and transistor Q6 turned on or off by path switching signal RC3 (k=3) between input J(=3) and output j(=4), respectively. Transistor Q10 turned on or off by path switching signal RC4 (k=4) is connected between input J(=4) and output j(=4). There is no transistor connected between inputs j=3, J=4 and outputs J<3, J<4.

Path-switching signal generating circuit 100 consists of resistors R1 to R4 each with one end connected to a common supply voltage Vcc and the other end grounded through a fuse links F1 to F4, and thus is constructed so as to generate path-switching signal RC1 to RC4 from each junction.

The operation of the above-described redundancy circuit will be described assuming that there are two failed memory cells (not shown) in one word line (row) in the regular memory cell array (not shown) in the semiconductor memory device.

In write mode, at the timing of data-input into the corresponding place of the regular write shift register (not shown) to the first failed memory cell of a write shift register array, the first write data DTI (DTI-1) is, on a write clock signal WCK, input into the redundancy write shift register, and captured and held in the first-place 11 of it.

At the timing of data-input into the corresponding place of the regular write shift register to the second failed memory cell of a write shift register array, the second write data DTI (DTI-2) is, on a write clock signal WCK, input into the redundancy write shift register, and captured and held in the first-place 11. At the same time, the first data DTI-1 is shifted to the second place 12.

Once the entire one-line data is held in the normal write shift register, write-data transfer signal WDT goes active. In turn, data DTI-2 and DTI-1 of places 11, 12 of redundancy write shift register 1 are transferred to, and stored in, the memory cells in memory cell columns 31, 32 selected by one of word lines WL1 to WLn.

In read mode, for instance, assuming that the above-mentioned data DTI-1 and DTI-2 are read out, then data DTI-1 and DTI-2 stored in the memory cells in memory cell columns 31, 32 selected by the same word line as in the write operation are read out.

As in this embodiment, when a fabricated memory device has been inspected to have two failed memory cells in one row in the regular memory cell array, fuse link F2 in the memory device is blown by a known external procedure. Then transistors Q2, Q3 are turned on by path switching signal RC2, and consequently the data of memory cell column 32 in redundancy memory cell array 3 is transferred to the last-place 54 of read data register 5 and the data of memory cell column 31 to the place 53.

Moreover, when there is found one failed memory cell in one row in the regular memory array, fuse link F1 in path-switching signal generating circuit 100 is blown. Then path switching signal RC1 goes to supply voltage level Vcc, which in turn causes transistor Q1 to turn on, and consequently the data of memory cell column 31 in redundancy memory cell array 3 is transferred to the last place 54 of read data register 5 via transistor Q44 of read data transfer circuit 4. Other path switching signals RC2 to RC4 remain grounded, that is, at ground potential level through fuse links F2 to F4, respectively, and hence transistors Q2 to Q10 remain off.

Likewise, when there are three failed memory cells in one row, fuse link F3 is blown, with the result that the data of memory cell column 33 is transferred to place 54 of read data register 5, the data of memory cell column 32 to place 53, and the data of memory cell column 31 to place 52. Likewise, when four failed memory cells are found, fuse link F4 is blown, with the result that the data of memory cell column 34 is transferred to place 54 of read data register 5, and the data of memory cell column 33 to place 53, the data of memory cell column 32 to place 52, and the data of memory cell column 31 to place 51.

In other words, the first-read data is transferred to, and stored in, the last place 54 of read data-register 5, and the succeeding read-data is stored at the preceding place, and so on. In output-control signal generating circuit 8, therefore, decoders 84, 83, 82 and 81 may be set so that always output control signals OC4, OC3, OC2, and OC1 go active in sequence. This enables omission of the troublesome work of altering the contents of decoders 81 to 84 in accordance with the number of failed memory cells, and instead only a very simple procedure of blowing the fuse link of the corresponding ordinal number to the number of failed memory cells is necessary, with an effect of minimizing risk of mistake involving the switching work which must be performed in accordance with the number of failed memory cells.

As described above, in output-control signal generating circuit 8, at the time of reading out data DTI-1, or the data of the first failed memory cell of the regular memory cell array, output control signal OC4 of active level, on read clock signal RCK, is generated from decoder 84. This signal turns on transistor Q64 of output data transfer circuit 6, and consequently data DTI-1 held in place 54 of read data register 5 is transferred to output bus 7 and output as output data DTO.

Similarly, at the time of readout of data DTI-2, output control signal OC3 of active level is output from decoder 83, and in turn transistor Q63 is turned on.

Then data DTI-2 held in place 53 of read data register 5 is transferred to output bus 7.

Figure 2:
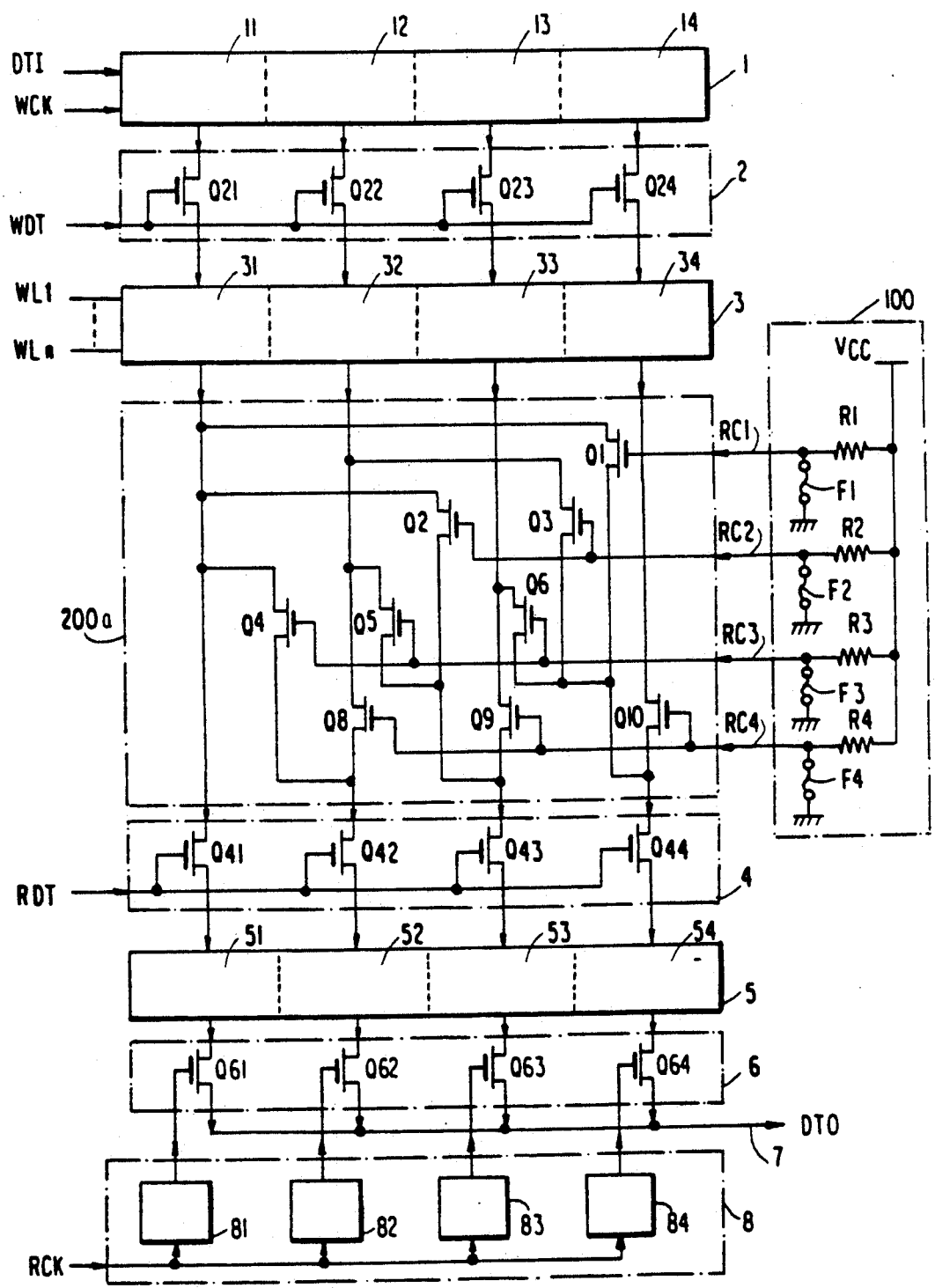
FIG. 2 is a circuit diagram of a second embodiment of the present invention involving a redundancy circuit in a semiconductor memory device.

FIG. 2 is a circuit diagram for illustrating the second embodiment of the present invention involving a redundancy circuit. This embodiment is distinguished from the first embodiment in the respect that data-transfer path switching circuit 200a is provided with a conductor directly connecting the input of j=1 and the output of j=1, thereby making transistor Q7 unnecessary.

In this embodiment, the data of memory cell column 31 of redundancy memory cell array 3 is always transferred to place 51 of read data register 5. When one memory cell is faulty, therefore, the data of memory cell column 31 is transferred to, and held in, places 54 and 51 of read data register 5. Since one piece of data only can be read out by read clock signal RCK, however, only the data held in place 54 is read out, and the data held in place 51 is not read out. Similarly, when two memory cells are faulty, only respective data held in places 54 and 53 are read out. When three memory cells are faulty, only respective data held in places 54, 53 and 52 are read out. In the last two cases, the data held in place 51 is not read out. Besides, when four memory cells are faulty, respective data of memory cell columns 31, 32, 33 and 34 are transferred to the corresponding places 51, 52, 53 and 54, and these four data are output in order from place 54 to place 51.

In this way, the second embodiment is the same in operation as the first embodiment except that because of directly connecting "j=1" input and "j=1" output of data-transfer path switching circuit 200a by a conductor connected between them, extra data, when three memory cells are faulty, is transferred to, and held in, place 51 of read data register. It is as good in effect as, and advantageous in the respect of needing one smaller number of transistors over, the first embodiment.

Figure 3:
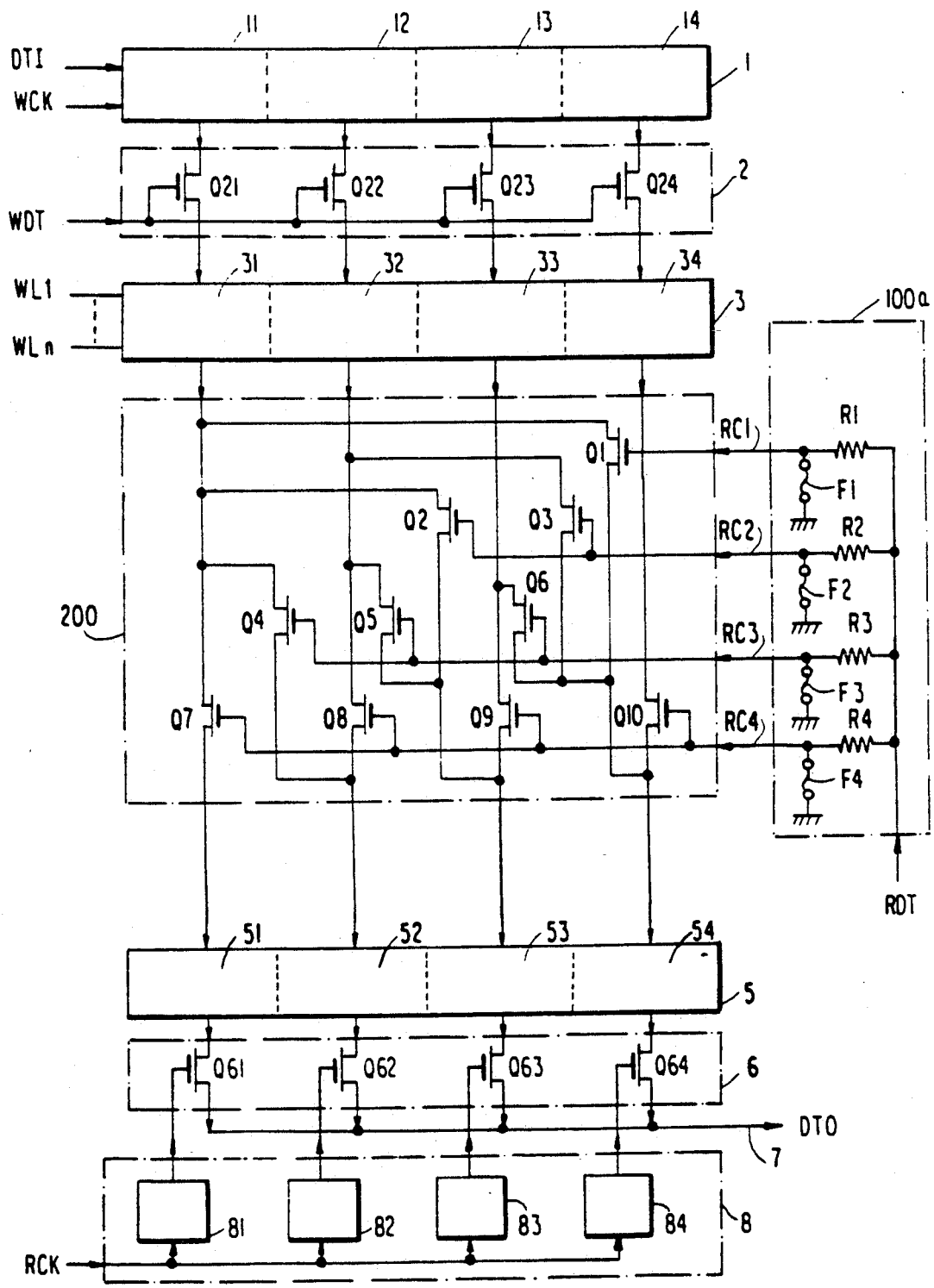
FIG. 3 is a circuit diagram of a third embodiment of the present invention involving a redundancy circuit in a semiconductor memory device.

FIG. 3 is a circuit diagram for illustrating the third embodiment of the present invention involving redundancy circuit.

This embodiment is distinguished from the first embodiment diagrammed in FIG. 1 in the respect that to respective one ends of resistors R1 to R4 of path-switching signal generating circuit 100a, read data-transfer signal RDT, instead of supply voltage Vcc, is applied thereby to control the timing when path switching signal RC1 to RC4 go to active level. Thus data-transfer path switching circuit 200 has additionally the function of read data transfer circuit 5, with an inevitable effect that read data transfer circuit (4 in FIG. 1) can be omitted.

For example, when one memory cell is faulty, fuse link F1 is blown. At this point, in the first embodiment, path switching signal RC1 always goes to supply voltage Vcc level, and hence transistor Q1 is in "on" state at all times. Once read-data transfer signal RDT goes active, the data of memory cell column 31 is transferred through transistors Q1, Q44 to place 54 of read data register 5. On the other hand, in the third embodiment, once read-data transfer signal RDT goes active, path switching signal RC1 goes to active level (supply voltage Vcc level), and in turn transistor Q1 is turned on, consequently the data of memory cell column 31 is transferred through transistor Q1 to place Q54 of read data register 5.

The third embodiment has advantage of needing four smaller number of transistors but having the same effect as that of the first embodiment.

Figure 4:
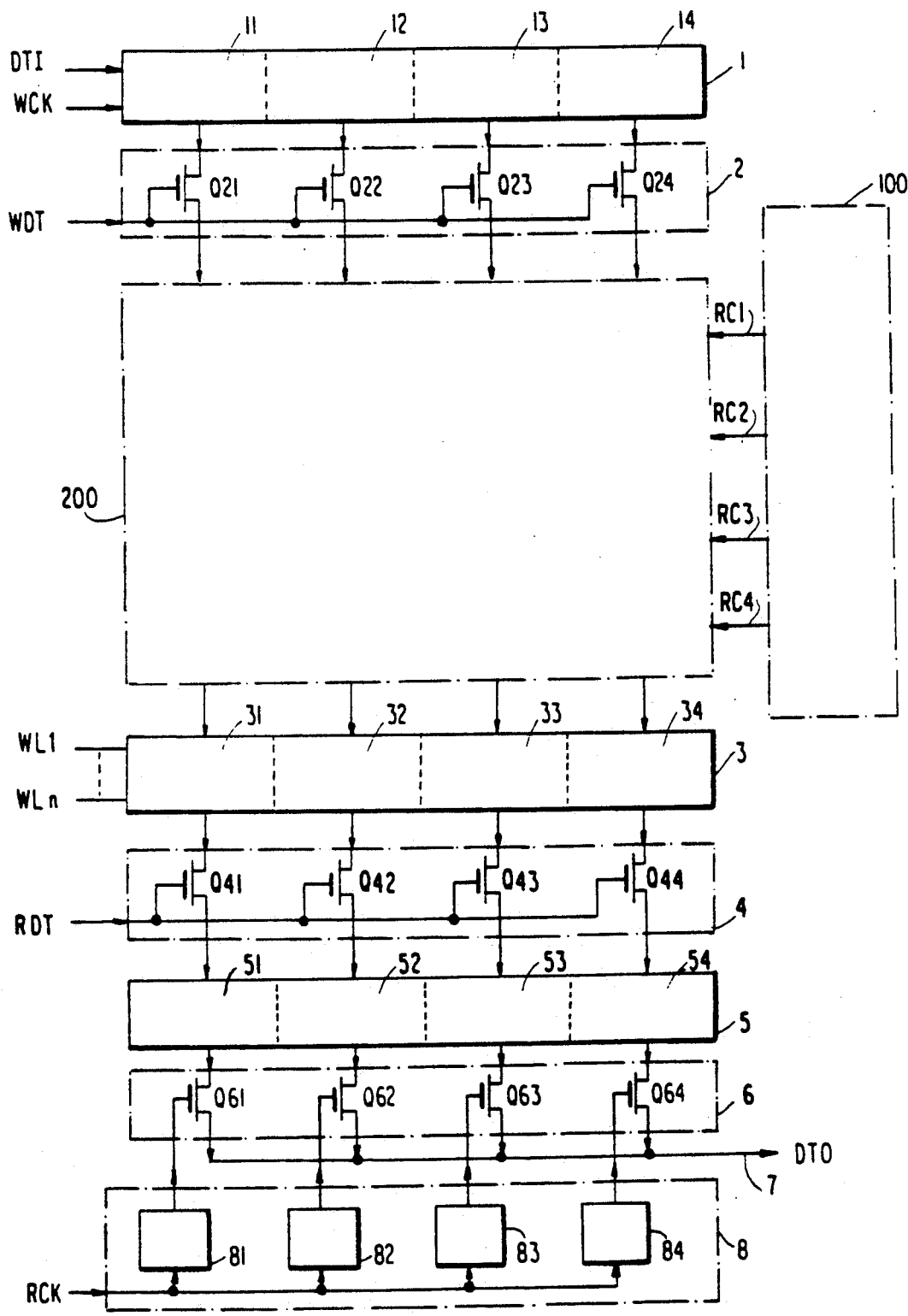
FIG. 4 is a circuit diagram of a fourth embodiment of the present invention involving a redundancy circuit in a semiconductor memory device.

FIG. 4 is a circuit diagram for illustrating the fourth embodiment of the present invention involving redundancy circuit.

In this embodiment, data-transfer path switching circuit 200 is provided between redundancy write shift register 1 and redundancy memory cell array 3. Its basic operation and effects are the same as the first embodiment, and therefore a detailed description is omitted.

In this construction, like the second embodiment, it is possible not only to directly connect the j=1 input and the j=1 output of data-transfer path switching circuit 200 by a conductor connected between them but also, like the third embodiment, to provide data-transfer path switching circuit 200 with the function of write data transfer circuit 2.

Figure 5:
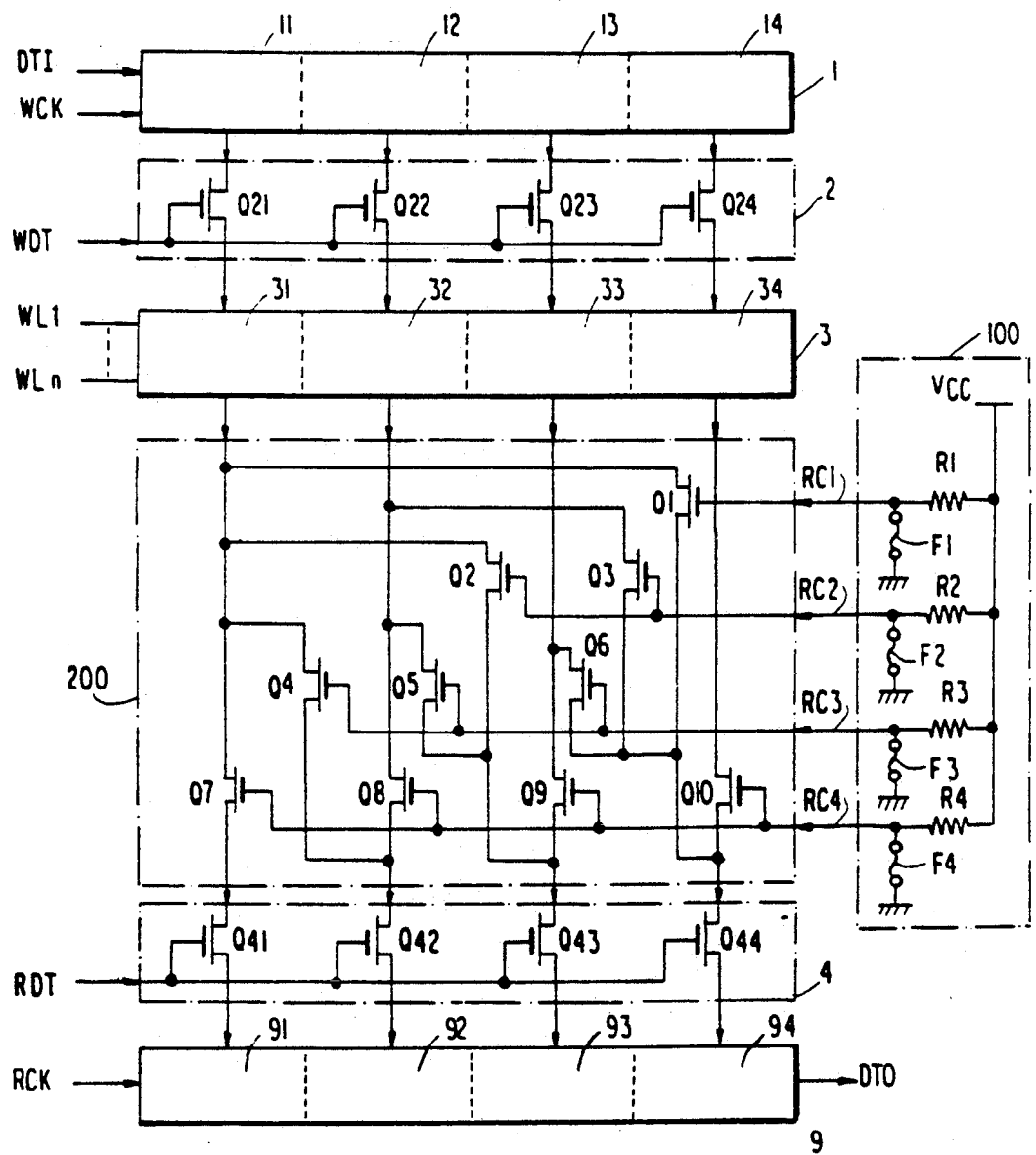
FIG. 5 is a circuit diagram of a fifth embodiment of the present invention involving a redundancy circuit in a semiconductor memory device.

FIG. 5 is a circuit diagram for illustrating the fifth embodiment of the present invention involving redundancy circuit.

In the redundancy circuit of this embodiment, the output circuit consists of a read shift register 9. Except this respect, the construction is the same as diagrammed in FIG. 1, and therefore the following description will be focused on this output circuit.

Redundancy read shift register 9 has four places 91-94 Once read-data transfer signal RDT goes to active level, respective data of cell columns 31 to 34 of redundancy memory cell array 3, under the control read data transfer circuit 4, are transferred through data-path switching circuit 200 to, captured and held in, the corresponding registers 91 to 94. Each time read clock signal RCK goes active, the data held in each place 91 to 94 is shifted over to the next place, and output at the output terminal the last place 94 as output data DTO in bit-serial way.

In the fifth embodiment, similarly the data to be firstly output is transferred to, and held in, the last place 94 of redundancy read shift register 9. Subsequent process is carried out such that in accordance with the number of input data, these data are transferred to, and held in, places 93, 92, 91 in the order of being output.

After starting the output of data from the regular memory cell array, at the timing of outputting the data corresponding to the failed memory cell, read clock signal RCK goes active, in response to which the data held in the last place 94 of the redundancy read shift register 9 is output. Simultaneously with this, respective data held in each place 93, 92, 91 is shifted to the next place, consequently the data to be output in the second turn being held in the last place 94. Thus data DTO are output in bit-serial way from the last register cell 94.

In the fifth embodiment, before starting input/output of data, a properly-selected fuse link in path-switching signal generating circuit 100 is blown, thereby the data-transfer path from redundancy memory array 3 to redundancy read shift register 9 being determined by data-transfer path switching circuit 200. Via these determined paths, the data are transferred to read shift register 9, and held in places 94, 93, 92 and 91 of it, in the order of being output as the data to be firstly output in the last place 94 and in sequence in accordance with the number of the input data.

Likewise, when the number of data input into the redundancy circuit, which is the number of failed memory cells in one row of the regular memory cell array is smaller than the number of places of each register, or the like, though needed in the prior art, the procedure is unneeded that any data entered in redundancy read shift register 9 must be shifted to the last place 94 previously to be output to the external, with an effect of enabling to speed up data-read speed to the external.

The fifth embodiment is of redundancy data output circuit consisting of a redundancy read shift register 9. It is as a matter of course that this embodiment may be modified by application of not only the constructions of FIGS. 2 and 3, but also the construction of FIG. 4 that data-transfer path switching circuit 200 or 200a is provided between redundancy write shift register 1 and redundancy memory cell array 3.

The sixth embodiment of the present invention involving redundancy circuit will be described under.

Figure 6:
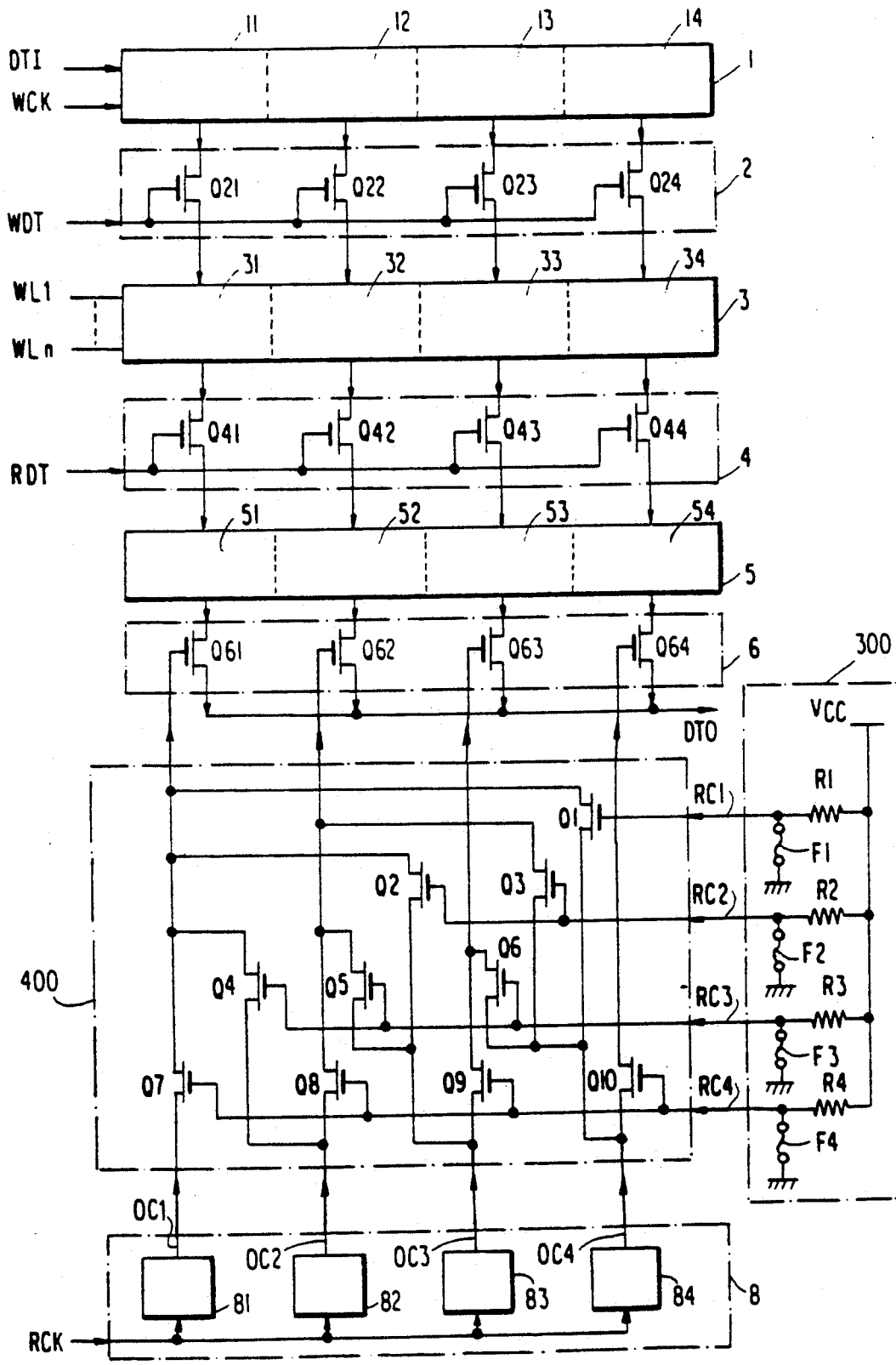
FIG. 6 is a circuit diagram of a sixth embodiment of the present invention involving a redundancy circuit in a semiconductor memory device.

Referring to FIG. 6, this redundancy circuit is provided, between output control signal generating circuit 8 and output data transfer circuit of redundancy circuit diagrammed in FIG. 1, with an output control signal path switching circuit 400 for supplying output control signals OC1 to OC4 from output control signal generating circuit 8 to output transistors Q61 to Q64 of data transfer circuit 6 under control, by path switching signals RC1 to RC4, of the switching of respective paths of those output control signals; and a path-switching signal generating circuit 300 for generating path switching signals RC1 to RC4. Accordingly no data-transfer path switching circuit is provided between redundancy memory cell array 3 and read data transfer circuit 4, both being directly connected.

Output control signal circuit 400 is all the same as data-transfer path switching circuit 200 in the first embodiment except the respect of replacing the input and output by each other. Path-switching signal generating circuit 300 is all the same as path switching signal generating circuit 100.

In output control signal generating circuit 8, the decoders 84, 83, 82 and 81 have so fixed their contents so that output control signals OC4, OC3, OC2 and OC1 are always caused to go to active level in the order as mentioned above. The procedure of blowing a selected fuse link according to the number of failed memory cells in one row of the regular memory cell array, thus to specify respective paths of output control signals OC1 to OC4, is the same as in the first embodiment.

The first embodiment is constructed so that switching data-transfer paths from write shift register 1 to redundancy data output circuit can be switched. On the other hand in this embodiment, the data-transfer paths are unchanged compared with those in the prior art. With a redundancy data-output circuit consisting of a read data register 5 and others, the paths of output control signals OC1 to OC4 are so switched that the output control signal supplied to the transistor of output data transfer circuit 6 to be first turned on is OC4.

In this case, the contents of each decoder 81 to 84 in output control signal generating circuit 8 are fixed, paths of output control signal OC1 to OC4 are switched by very the simple work of blowing a selected fuse link, thus permitting to minimize risk of mistake in switching work.

The embodiments diagrammed in FIGS. 1 to 6 can be applied as they are when failed memory cell or cells are found only in one row of the regular memory cell array and when an equal number of failed memory cells are found in a plurality of rows. When the number of failed memory cells varies from row to row, however, it is difficult to apply these embodiments as they are. In the prior art, switch circuit for this case is complicated, too. To solve this problem, the seventh and eighth embodiments diagrammed in FIG. 7 and 8, respectively, have been developed.

Figure 7:
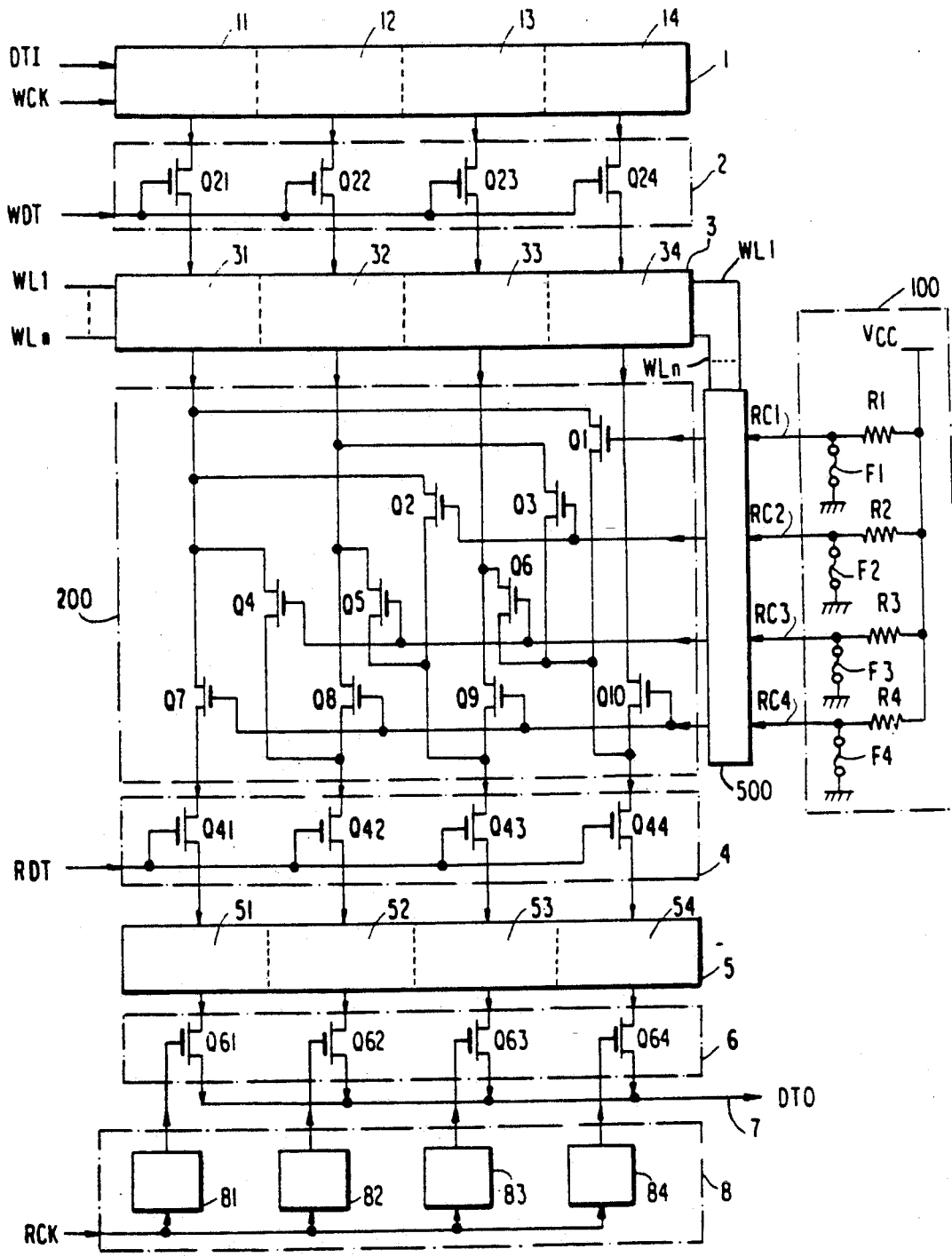
FIG. 7 is a circuit diagram of a seventh embodiment of the present invention involving a redundancy circuit in a semiconductor memory device.

Referring to FIG. 7, the redundancy circuit as the seventh embodiment of the present invention is constructed so that a path-switching signal selecting circuit 500 for, when word lines WL1 to WLn is at select level, selecting and supplying one of path switching signals RC1 to RC4 to data-transfer path switching circuit 200 is provided between path-switching signal generating circuit 100 and data-transfer path switching circuit 200.

Path-switching signal selecting circuit 500 is provided with programmable switch elements for selecting respective path switching signals RC1 to RC4 each being transmitted to respective specified transistor or transistors in data-transfer path switching circuit 200. Turn on or off of each switch element is controlled by the level of the associated word line WL1 to WLn, respectively.

The program is, for example, written so that assuming one failed memory cell is found in the corresponding row to a word line WLj and three failed memory cells in the corresponding row to another word line WLk, the active level of word line WLj turns on the switch element for selecting path switching signal RC1 being transmitted to transistor Q1, and the active level of word line WLk turns the switch element on for selecting path switching signal RC3 being transmitted to transistors Q4 to Q6.

Figure 8:
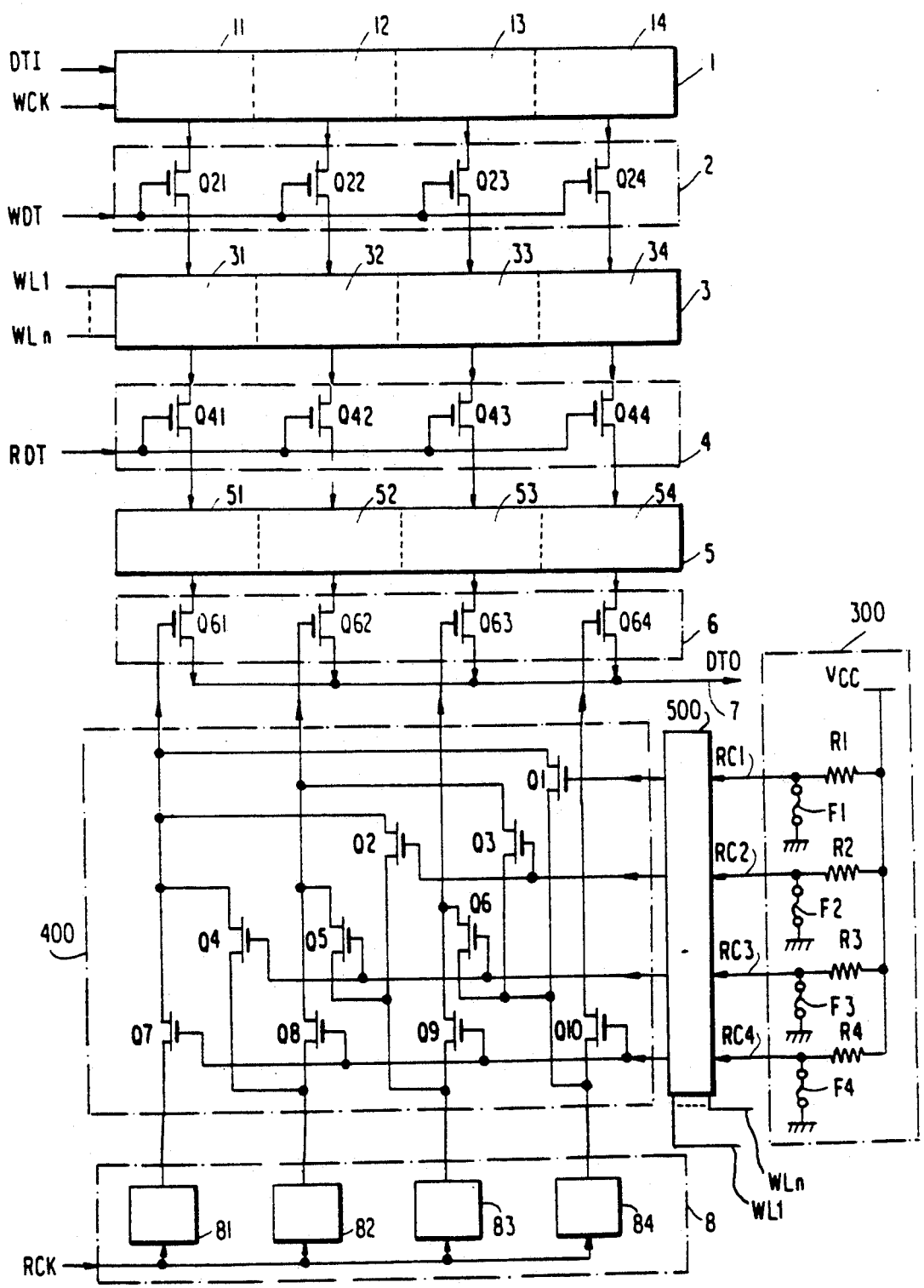
FIG. 8 is a circuit diagram of an eighth embodiment of the present invention involving a redundancy circuit in a semiconductor memory device.

Referring to FIG. 8, in the redundancy circuit as the eighth embodiment of the present invention, there is provided a path-switching signal selecting circuit 500 for selecting one from path switching signals RC1 to RC4 depending on the levels of word lines WL1 to WLn, and applying it to output control signal switching circuit 400 between a path-switching signal generating circuit 300 and output control path switching circuit 400 in redundancy circuit of FIG. 6. This path control-signal selecting circuit 500 is the same as the one diagrammed in FIG. 7.

As stated above, the construction that a path-switching signal selecting circuit 500 of simple design is provided between path-switching signal generating circuit 100 and data-transfer path switching circuit 200 and between path-switching signal generating circuit 300 and output control signal switching circuit 400, respectively, enables easy application in the cases the number of failed memory cells varying with row, as well.

In the above-described embodiments, path-switching signal generating circuit 100 or 300 consists of resistors R1 to R4 and fuse links F1 to F4, and is constructed to turn on suitable one or ones from transistors Q1 to Q10, when data-transfer path switching circuit 200, 200 a or output control signal path switching circuit 400 is at active level. These circuit designs are not limitative but may be used in any way so that it generates path switching signals RC1 to RC4.

Although the invention has been described with reference to specific embodiments, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any modifications or embodiments as fall within the scope of the invention.

What is claimed is:

1. A semiconductor memory device comprising a redundancy write shift register including a plurality of data storage and shift stages, a write data transfer circuit for transferring in parallel data stored in said redundancy write shift register in response to a write-data transfer signal, a redundancy memory cell array including a plurality of memory cells for storing in parallel data transferred by said write data transfer circuit in a data write mode and for reading out in parallel data stored therein in a data read mode, a read data transfer circuit for transferring data read out of said redundancy memory cell array in response to a read-data transfer signal, a redundancy data output circuit including a plurality of stages for capturing in parallel data from said read data transfer circuit and outputting the captured data in a bit-serial manner, data-transfer path control means responsive to switching data for controlling data transfer from said redundancy write shift register to said redundancy data output circuit such that the data from each stage of said redundancy write shift register is transferred to a corresponding stage or a different stage of said redundancy data output circuit, and a signal generating circuit for generating said switching data.

2. A semiconductor memory device according to claim 1, wherein said data-transfer path control means is provided between said redundancy write shift register and said redundancy memory cell array.

3. A semiconductor memory device according to claim 1, wherein said data-transfer path control means is provided between said redundancy memory cell array and said redundancy data output circuit.

4. A semiconductor memory device according to claim 1, wherein said redundancy data output circuit includes a read data register having a plurality of data storage stages for capturing and holding outputs of said read data transfer circuit, an output bus, an output transfer circuit for transferring under control of output control signals in sequence respective data held in the places of said read data register to said output bus, and an output control signal generating circuit for generating said output control signals.

5. A semiconductor memory device according to claim 1, wherein said redundancy data output circuit includes a redundancy read shift register for capturing and shifting outputs of said read data transfer circuit.

6. A semiconductor memory device according to claim 1, wherein said data-transfer control means includes a plurality of switch elements, each being provided between the jth input and the (j+(N−k))th output and turned on in response to kth one of said switching data being at active level, wherein j is any integer of from 1 ascending to N each allocated in sequence to the inputs and outputs of said data transfer path control means, from one end thereof, respectively, and k is any integer of 1 ascending to N and k≧j, and said signal generating circuit makes the kth one of said switching data active when the number of data inputted into said redundancy write shift register is k.

7. A semiconductor memory device according to claim 6, wherein each of said switch elements is composed of a transistor and said switching signal generating circuit includes a plurality of sets of a resistor and a fuse link, said resistor having one end connected to the first potential point and said fuse link having one end connected to the other end of said resistor and the other end connected the second potential point, said switching data being derived from each node of said resistor and said fuse link.

8. A semiconductor memory device according to claim 6, wherein the first input and the first output of said data-transfer path control means are connected through a conductor.

9. A semiconductor memory device according to claim 2, wherein each of said data transfer control means and said write data transfer circuit includes a plurality of switch elements, each switching element being provided between the jth output of said redundancy write shift register and the input of the (j+(N−k))th memory cell column input of said redundancy memory cell array and being turned on in response to kth one of said switching data being at active level, wherein j is any integer of 1 ascending to N each allocated to the outputs of said redundancy write shift register in sequence from one end thereof, and to respective inputs of said memory cell columns in said redundancy memory cell array, in sequence from the one end thereof, and k is any integer of 1 ascending to N and k≧j; and said signal generating circuit is a circuit provided with N couples, each consisting of a resistor permitting said write-data transfer signal to be inputted at one end thereof and a fuse link having one end connected to the other end of said registor and the other end thereof connected to the second potential point, and outputting respective switching data from respective junctions of said resistor-fuse link couples.

10. A semiconductor memory device according to claim 3, wherein each of said data transfer switching means and said read data transfer circuit includes a plurality of switch elements, each switching element being provided between the output of the jth memory cell column of said redundancy memory cell array and the (j+(N-k))th input of said read data transfer circuit and, when the kth one of said path switching signals is at active level, turn on, wherein j is any integer of 1 ascending to N each allocated to respective outputs of said redundancy memory cell columns in said redundancy memory cell array in sequence from one end thereof, and to the inputs of said redundancy data output circuit in sequence from the one end thereof, and k is any integer of 1 ascending to N and k≧j; and said path-switching signal generating circuit is a circuit provided with N couples each consisting of a resistor permitting said read-data transfer signal to be input at one end thereof, and a fuse link having one end connecting to the other end of said resistor and the other end thereof connecting to the second potential point, and outputting respective path switching signals from respective junctions of said resistor-fuse link couples.

11. A semiconductor memory device comprises:
a redundancy write shift register, consisting of a plurality of data-storage places, for capturing in sequence data at the input terminal, at the same time shifting the data of each place, if held therein, to the next place, and outputting the thus-loaded data from respective outputs of said places;
a write data transfer circuit for transferring in parallel respective data of the places of said redundancy write shift register to respective outputs under the timing of a write-data transfer signal;
a redundancy memory cell array, including a plurality of memory cell columns corresponding respectively to the places of said redundancy shift register, for writing and storing in parallel in respective selected memory cells from said memory cell columns, respective data from the corresponding outputs of said write data transfer circuit, and reading out in parallel respective data stored in said respective selected memory cells from said memory cell columns;

a read data transfer circuit for transferring to outputs thereof, in parallel respective data read out from said memory cell columns in said redundancy memory cell array under the timing of a read-data transfer signal;

a read data register, including data-storage places corresponding respectively to said memory cell columns in said redundancy memory cell array, for capturing and holding in said places respective data from the outputs of said read data transfer circuit;

an output bus;

an output transfer circuit for transferring under control of output control signals in sequence respective data held in the places of said read data register to said output bus;

an output-control signal generating circuit, including a plurality of data transfer elements, for generating said output control signals;

an output-control-signal path switching circuit for switching under by switching signals respective paths of the output control signals from said output control signal generating circuit so that control signals are sent to the data transfer elements of said output-data transfer circuit; and a switching-signal generating circuit for generating said switching signals.

12. A semiconductor memory device according to claim 11, wherein said output-control-signal path switching circuit is a circuit with switch elements, each being provided between the jth input and the (j+(N-k))th output and, when the kth path switching signal is at active level, turned on, wherein j is any integer of from 1 ascending to N each allocated in sequence to respective output-control-signal inputs and output-control-signal outputs of said output-control-signal path switching circuit, from one end thereof, respectively, and k is any integer of 1 ascending to N and k≧j; and said switching-signal generating circuit is a circuit having N couples each of a resistor and a fuse link, said resistor having one end connecting to the first potential point and said fuse link having one end connecting to the other end of said resistor, and the other end connecting the second potential point, for outputting respective switching signals from respective junctions of said resistor-fuse link couples.

13. A semiconductor memory device according to claim 1, wherein memory cells of said redundancy memory cell array are selected by one of a plurality of word lines; a path switching signal selecting circuit for selecting, by a specified word line of said plurality of word lines, one from a plurality of path switching signals output from said path switching signal generating circuit, and supplying the selected path switching signal to said data-transfer path switching means is provided between said data-transfer path switching means and said path-switching signal generating circuit.

14. A semiconductor memory device according to claim 12, wherein memory cells of said redundancy memory cell array are selected by one of a plurality of word lines; and a switching-signal selecting circuit for selecting, by a specified word line of said plurality of word lined, one from a plurality of switching signals output from said switching-signal generating circuit, and supplying the selected switching-signal to said output control signal path switching circuit is provided between said output-control signal path switching circuit and said switching signal generating circuit.

* * * * *